United States Patent
Sato et al.

(10) Patent No.: US 12,018,359 B2
(45) Date of Patent: Jun. 25, 2024

(54) COMPOSITE TUNGSTEN OXIDE FILM AND METHOD FOR PRODUCING SAME, AND FILM-DEPOSITED BASE MATERIAL AND ARTICLE EACH PROVIDED WITH SAID FILM

(71) Applicant: SUMITOMO METAL MINING CO., LTD., Tokyo (JP)

(72) Inventors: Keiichi Sato, Tokyo (JP); Isao Ando, Tokyo (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 733 days.

(21) Appl. No.: 17/053,551

(22) PCT Filed: Apr. 17, 2019

(86) PCT No.: PCT/JP2019/016401
§ 371 (c)(1),
(2) Date: Nov. 6, 2020

(87) PCT Pub. No.: WO2019/216134
PCT Pub. Date: Nov. 14, 2019

(65) Prior Publication Data
US 2021/0238727 A1 Aug. 5, 2021

(30) Foreign Application Priority Data
May 9, 2018 (JP) ................... 2018-090939

(51) Int. Cl.
C23C 14/08 (2006.01)
C23C 14/58 (2006.01)

(52) U.S. Cl.
CPC .......... *C23C 14/08* (2013.01); *C23C 14/5806* (2013.01)

(58) Field of Classification Search
None
See application file for complete search history.

(56) References Cited

U.S. PATENT DOCUMENTS

| | | | | |
|---|---|---|---|---|
| 3,457,106 | A * | 7/1969 | Gillery | C23C 14/088 359/359 |
| 2008/0054229 | A1* | 3/2008 | Odaka | C23C 14/5806 252/520.1 |
| 2018/0170021 | A1 | 6/2018 | Machida et al. | |

FOREIGN PATENT DOCUMENTS

| CN | 104006560 A | 8/2014 |
|---|---|---|
| EP | 3686312 A1 | 7/2020 |

(Continued)

OTHER PUBLICATIONS

Aug. 26, 2021 Search Report issued in European Patent Application No. 19800654.6.

(Continued)

*Primary Examiner* — Kim S. Horger
(74) *Attorney, Agent, or Firm* — Oliff PLC

(57) ABSTRACT

Purpose of the present invention is to provide a composite tungsten oxide film having a transmissivity of light with a wavelength of 700 to 1200 nm, in addition to a function to shield light by absorbing light, a function to generate heat by absorbing light and a function to release electrons by absorbing light, and also having a substantial radio wave transmissivity, and having both of an infrared light absorbing property in an infrared light region and a transparency in a visible light region, and a method for manufacturing the composite tungsten oxide film, and further, to provide a film-deposited base material or an article using any of or a plurality of the above functions. A composite tungsten oxide film comprising a composition represented by a general formula $M_xW_yO_z$ (wherein, an element M is one or more elements selected from alkaline metal, alkaline earth metal, (Continued)

Fe, In, Tl, and Sn, an element W is tungsten, and an element O is oxygen) as main components, wherein $0.001 \leq x/y \leq 1$, $2.2 \leq z/y \leq 3.0$, organic components are not contained substantially, a sheet resistance is $10^5$ ohms per square or more, a transmittance in a wavelength of 550 nm is 50% or more, a transmittance in a wavelength of 1400 nm is 30% or less, and also, an absorptance in a wavelength of 1400 nm is 35% or more, and an absorptance in a wavelength of 800 nm with respect to an absorptance in a wavelength of 1400 nm is 80% or less.

8 Claims, 2 Drawing Sheets

(56) References Cited

FOREIGN PATENT DOCUMENTS

| | | |
|---|---|---|
| JP | H05-113085 A | 5/1993 |
| JP | H08-12378 A | 1/1996 |
| JP | 2002-020142 A | 1/2002 |
| JP | 2006-096656 A | 4/2006 |
| JP | 4096205 B2 | 6/2008 |
| JP | 2010-215451 A | 9/2010 |
| JP | 2011-503274 A | 1/2011 |
| JP | 2012-021066 A | 2/2012 |
| JP | 2013-025949 A | 2/2013 |
| JP | 2015-117353 A | 6/2015 |
| JP | 2015-527700 A | 9/2015 |
| JP | 2016-528343 A | 9/2016 |
| JP | 2017-092210 A | 5/2017 |
| JP | 2018-026586 A | 2/2018 |
| WO | 2006/049025 A1 | 5/2006 |
| WO | 2006/100799 A1 | 9/2006 |
| WO | 2006/103871 A1 | 10/2006 |
| WO | 2017/002763 A1 | 1/2017 |
| WO | WO-2017094909 A1 * | 6/2017 ............... B05D 7/04 |
| WO | 2019/058737 A1 | 3/2019 |

OTHER PUBLICATIONS

Jul. 16, 2019 International Search Report issued in International Patent Application No. PCT/JP2019/016401.

* cited by examiner

COMPOSITE TUNGSTEN OXIDE FILM AND METHOD FOR PRODUCING SAME, AND FILM-DEPOSITED BASE MATERIAL AND ARTICLE EACH PROVIDED WITH SAID FILM

BACKGROUND OF THE INVENTION

Field of the Invention

The present invention relates to a composite tungsten oxide film and a method for producing same, and further, relates to a film-deposited base material provided with the composite tungsten oxide film and an article utilizing a function of the composite tungsten oxide film. This application is based upon and claims the benefit of priority from Japanese Patent Application No. 2018-090939 filed on May 9, 2018 in Japan, which are incorporated by reference herein.

Description of Related Art

As a light-shielding member used for window materials or the like, various materials are proposed. For example, in Patent Literature 1, as a light-shielding member of a window or the like, a light-shielding member of a film having a mirror surface state formed by a vapor deposition of a metal such as aluminum, is described. In addition, there is a light-shielding member of a film formed by sputtering silver or the like. However, when this type of light-shielding member is used, it will have a half mirror appearance, so a reflection is too bright to be used at outside, and it will be an issue for view. Further, a metal film of aluminum, silver, or the like is having high conductivity, so it also reflects radio waves and it will be an issue that devices utilizing radio waves such as portable phones or smart phones will be difficult to be connected.

In contrast, the present applicant has proposed an infrared shielding fine particle dispersion having composite tungsten oxide fine particles described in Patent Literature 2. The composite tungsten oxide fine particles efficiently absorb solar rays, especially a light of near-infrared region, and also, having high transparency with respect to a visible light. In Patent Literature 2, the infrared shielding fine particle dispersion is formed such that, the composite tungsten oxide fine particles are dispersed in an appropriate solvent to prepare a dispersion liquid, a medium resin is added into the obtained dispersion liquid, and then the dispersion liquid is coated onto a surface of a base material to form a thin film, and the infrared shielding fine particle dispersion is having both heat shielding property and radio wave transmissivity.

In Patent Literature 3, a composite tungsten oxide film manufactured by heat-treating a substrate after applying a solution containing raw material compounds of composite tungsten oxide on the substrate, is disclosed.

The invention described in Patent Literature 2 and Patent Literature 3 requires a high-level coating technique in order to secure a flatness and a uniformity of film thickness in large area, and a control of film thickness, as the film is formed by a coating method. In addition, these methods basically use fine particles of composite tungsten oxide compound, so it is necessary to control a composition of fine particles to be used, in order to manufacture a composition out of stoichiometric composition.

In addition, in a near infrared region with a wave length of 700 to 1200 nm, a transmittivity may be required in a communication device, an imaging device, a sensor or the like using a near infrared light for on-vehicle use. The film formed by a coating liquid containing the composite tungsten oxide fine particles described in embodiments of Patent Literature 2 and Patent Literature 3 was having a problem that it absorbs a light in the near infrared region.

As other means for obtaining such composite tungsten oxide thin film, there are physical methods such as a sputtering method and a deposition method as can be seen in examples of Patent Literature 1. A thin film deposited by a physical film deposition method can be a film excluding elements (for example, an organic matter such as resin or solvent) other than the aimed composition. In addition, it does not need to use a medium resin or a dispersing agent which are not suitable for high temperature treatment, so it can be used for high temperature manufacturing process, and for example, it can be used for a manufacturing process for a reinforced glass, which is heat-treated at high temperature. Further, a film thickness of the thin film deposited by a physical film deposition method can be controlled easily, and the thin film can be easily formed to be a laminated structure.

In Patent Literature 4, a window glass for a vehicle and a method for manufacturing same is proposed, and a large size inline type sputtering device capable of treatment to a large area substrate of a window for a vehicle and the like is used. When such manufacturing equipment can be used, a film with stably high quality and with uniform film thickness, and also, with high productivity, can be obtained easily. In addition, a source of film deposition in a physical film deposition method (for example, a target material in a sputtering method) may not be a single compound, and for example, it may be a mixture composed of a plurality of compounds or a combination of compositions of single element, so a degree of freedom in a selection of composition is extremely high.

In Patent Literature 5, a composite tungsten oxide film prepared by a sputtering method is proposed. A composite tungsten oxide film, which is composed of tungsten and at least one type of elements selected from a group consisting of IVa group, Ma group, VIIb group, VIb group and Vb group in the periodic table, is formed on a glass substrate. However, the oxide film with this composition is not having a sufficient heat ray shielding performance as an infrared transmittance is 40% or more, and there was an issue that it does not exert its function unless it is configured as a multi-layer film with other transparent dielectric film.

In addition, in Patent Literature 6, an oxide tungsten to be used for absorbing a near infrared ray and changing it to heat (photothermal conversion) is disclosed.

In addition, in Patent Literature 7, a use of composite tungsten oxide particles for a photoelectric conversion by absorbing a light energy of a solar light and by a charge transfer of the light energy into a coloring matter, is indicated.

As the above, a composite tungsten oxide is having a function to generate heat by absorbing light and a function to release electrons by absorbing light in addition to a function to shield light by absorbing light. However, in both of Patent Literature 6 and Patent Literature 7, a film deposition by coating a solution containing fine particles is required, so it is not having an advantage of a physical film deposition method as well as the above.

Patent Literature 1: JP H5-113085 A
Patent Literature 2: JP 4096205 B
Patent Literature 3: JP 2006-096656 A
Patent Literature 4: JP 2002-020142 A
Patent Literature 5: JP H8-12378 A Patent Literature 6: JP 2011-503274 A
Patent Literature 7: JP 2013-025949 A

SUMMARY OF THE INVENTION

As mentioned above, it still cannot be said that a heat ray shielding performance of a composite tungsten oxide film by the conventional physical film deposition method is sufficient, and further, with respect to a use in a photothermal conversion and a use in a photoelectric conversion, even its example has not been indicated. On the other hand, a film formed by a coating method is having an issue that it is inferior in a transmissivity in the near infrared region.

Here, the present invention is invented to solve such circumstances, and a purpose of the present invention is to provide a composite tungsten oxide film having a transmissivity of light in a wavelength of 700 to 1200 nm, in addition to a function to shield light by absorbing light, a function to generate heat by absorbing light and a function to release electrons by absorbing light, and also having a substantial radio wave transmissivity, and having both of an infrared light absorbing property in an infrared light region and a transparency in a visible light region, and a method for producing the composite tungsten oxide film, and further, to provide a film-deposited base material or an article using any of or a plurality of the above functions.

As a result of keen examination about a composite tungsten oxide film with respect to the above problems, the inventors have achieved to obtain an excellent composite tungsten oxide film having a function to generate heat by absorbing light, a function to release electrons by absorbing light, and a function to have a transmissivity in a near infrared region while absorbing and shielding light, by optimizing a condition at the time of film deposition by a physical film deposition method.

In other words, one embodiment of the present invention is a composite tungsten oxide film comprising a composition represented by a general formula $M_xW_yO_z$ (wherein, an element M is one or more elements selected from alkaline metal, alkaline earth metal, Fe, In, Tl, and Sn, an element W is tungsten, and an element O is oxygen) as main components, wherein $0.001 \leq x/y \leq 1$, $2.2 \leq z/y \leq 3.0$, organic components are not contained substantially, a sheet resistance is $10^5$ ohms per square or more, a transmittance in a wavelength of 550 nm is 50% or more, a transmittance in a wavelength of 1400 nm is 30% or less, and also, an absorptance in a wavelength of 1400 nm is 35% or more, and an absorptance in a wavelength of 800 nm with respect to an absorptance in a wavelength of 1400 nm is 80% or less.

According to one embodiment of the present invention, a composite tungsten oxide film having a substantial radio wave transmissivity, and having both of an infrared light absorbing property in an infrared light region and a transparency in a visible light region, can be provided as a photoelectric conversion film, a photothermal conversion film, or an infrared shielding film which does not occur a radio wave interference.

In addition, in one embodiment of the present invention, by forming a composite tungsten oxide film having both of the above features and a transmissivity in a near infrared region in a wavelength of 700 to 1200 nm, a film having excellent light absorbing property in a use requiring a transmission of a wavelength in the above region is provided.

In addition, in one embodiment of the present invention, the composite tungsten oxide film may be derived from a spattering film deposition.

By being derived from the spattering film deposition, the composite tungsten oxide film capable of deposition of a film stably, and with an extremely wide freedom in a selection of compositions is provided.

In addition, in one embodiment of the present invention, the element M may be one or more elements selected from Cs, Rb, K, Tl, In, Ba, Li, Na, Ca, Sr, Fe and Sn.

By selecting the element M from the above elements, the composite tungsten oxide film having higher infrared shielding function, photothermal conversion function, and photoelectric conversion function is provided.

In addition, in one embodiment of the present invention, the composite tungsten oxide film is having a film thickness thicker than 20 nm.

By having such film thickness, the composite tungsten oxide film having high infrared shielding function, photothermal conversion function, and photoelectric conversion function is provided.

Other embodiment of the present invention is a film-deposited base material in which the composite tungsten oxide film is deposited on at least one surface of a base material to be subjected to film deposition.

By providing the film-deposited base material in which the composite tungsten oxide film is deposited, it may be in a form provided for practical use having a mechanical characteristic and a workability.

In addition, at this time, in other embodiment of the present invention, the film-deposited base material may be having a thermal deformation temperature or a softening point of 400° C. or more.

By having such features, it may be the film-deposited base material having more excellent functions, by a heat treatment after the film deposition.

In addition, in other embodiment of the present invention, the base material to be subjected to film deposition may be a glass.

By selecting a glass as the base material to be subjected to film deposition, an infrared shielding function, a photothermal conversion function, and a photoelectric conversion function can be given to an equipment using a glass used in a wide fields such as a glass window of a window for a vehicle or a window for a building, a glass fiber, a glass for a solar power generation, a glass for a display, a glass for a lens or a mirror, a glass substrate used for a semiconductor, MEMS, or the like.

In addition, other embodiment of the present invention is an article comprising one or more of the composite tungsten oxide film and/or the film-deposited base material.

According to other embodiment of the present invention, the article having low environmental load at the time of production and capable of reducing energy is provided for various use inexpensively in large quantities.

Other embodiment of the present invention is a method for producing a composite tungsten oxide film comprising a composition represented by a general formula $M_xW_yO_z$ (wherein, an element M is one or more elements selected from alkaline metal, alkaline earth metal, Fe, In, Tl, and Sn, an element W is tungsten, an element O is oxygen, and $0.001 \leq x/y \leq 1$, $2.2 \leq z/y \leq 3.0$) as main components, the method comprising: a film deposition process for deposition of a film by a physical film deposition method using a sputtering target composed of a compound of the element M, the element W, and the element O; and a heat treatment process for heat-treating the film, wherein the conditions of the film deposition process and the heat treatment process are as any of 1) or 2) below:

1) after deposition of the film by sputtering in an inert gas in the film deposition process, the film is heat-treated at a temperature of 400° C. to 600° C. in a gas containing oxygen in the heat treatment process;
2) after deposition of the film by sputtering in a gas containing oxygen in the film deposition process, the film is heat-treated at a temperature of 400° C. to 900° C. in an inert or reducing atmosphere in the heat treatment process.

According to such production method, the composite tungsten oxide film having the above features, which is having high quality and a uniform thickness, is produced easily with an existing production facility with high productivity and stability.

According to the present invention, a composite tungsten oxide film having a substantial radio wave transmissivity, and having both of an infrared light absorbing property in an infrared light region and a transparency in a visible light region, is provided as a photoelectric conversion film, a photothermal conversion film, or an infrared shielding film which does not occur a radio wave interference. In addition, such composite tungsten oxide film is provided by a physical production method, in which used raw materials are excellent for a long-time storage and not limited at the time of a transportation or a storage of dangerous substances, by a relatively harmless method at the time of a film deposition, which is widely used industrially.

DETAILED DESCRIPTION OF THE INVENTION

Figure 1:
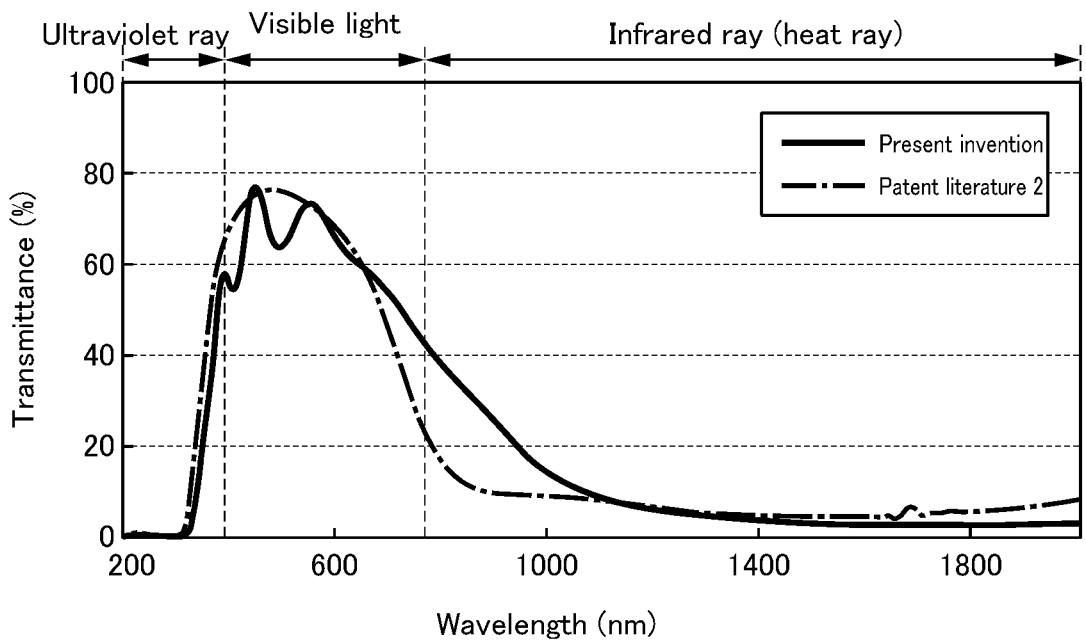
FIG. 1 is a view illustrating a difference between a representative optical characteristic of a composite tungsten oxide film of the present invention and a representative optical characteristic of an infrared shielding material fine particle dispersion described in Patent Literature 2.

Hereinafter, explaining about a composite tungsten oxide film and a method for producing same in the following order. In addition, the present invention should not be limited by the following examples, and it can be modified optionally within a scope not deviating from a gist of the present invention.

1. Composite tungsten oxide film
2. Method for producing composite tungsten oxide film
   2-1. Film deposition process
   2-2. Heat treatment process
3. Film-deposited base material
4. Article <1. Composite Tungsten Oxide Film>

Explaining about a composite tungsten oxide film relating to one embodiment of the present invention. A composite tungsten oxide film relating to one embodiment of the present invention is a film comprising a composition represented by a general formula $M_xW_yO_z$ (wherein, an element M is one or more elements selected from alkaline metal, alkaline earth metal, Fe, In, Tl, and Sn, an element W is tungsten, and an element O is oxygen) as main components, and it is composed in a range of $0.001 \le x/y \le 1$, $2.2 \le z/y \le 3.0$.

About a detail of a composition range, it is described in detail in Patent Literature 2 filed by the present applicant, and it is necessary to comprise a composite tungsten oxide within this composition range, in order to provide a film having high transparency and infrared light absorbing property. A basic optical characteristic of the composite tungsten oxide film is derived from an atomic arrangement of the element M, tungsten W and oxygen O. On the other hand, one embodiment of the present invention is the composite tungsten oxide film having different characteristic from the infrared shielding body described in Patent Literature 2, and in below, it is explained in detail by comparing the present invention with the invention relating to Patent Literature 2 accordingly.

The present applicant has indicated that the optical characteristic of the composite tungsten oxide is derived from two types of absorption, by a fine particle dispersion film of the composite tungsten oxide relating to Patent Literature 2. However, the optical characteristic of the composite tungsten oxide film in the present invention shows a characteristic different from the fine particle dispersion film relating to Patent Literature 2, as an absorption of near infrared region in a wavelength of 700 to 1200 nm is low. The reason for this is assumed that it is caused by a difference of a continuous film and the fine particle dispersion film as described in below, but its detail is not understood at this time.

The element M of the composite tungsten oxide film relating to one embodiment of the present invention is one or more elements selected from alkaline metal, alkaline earth metal, Fe, In, Tl, and Sn, more preferably, one or more elements selected from Cs, Rb, K, Tl, In, Ba, Li, Na, Ca, Sr, Fe, and Sn. This range is narrower than constituent elements described in Patent Literature 2, but this only indicates elements in which an effect is confirmed by examples, so the elements described in Patent Literature 2 not included in the present invention may at least have a similar function.

In the composite tungsten oxide film relating to one embodiment of the present invention, in the general formula $M_xW_yO_z$, an atomic ratio x/y of the element M and W (tungsten) is $0.001 \le x/y \le 1$, and an atomic ratio z/y of O (oxygen) and W (tungsten) is $2.2 \le z/y \le 3.0$. When x/y is less than 0.001, a sufficient amount of free electrons will not be generated and an infrared shielding effect cannot be obtained. In addition, when x/y is more than 1, an impurity phase will be formed in the composite tungsten oxide film. When z/y is less than 2.2, a crystal phase of $WO_2$, which is not a target, will be generated in the composite tungsten oxide film. In addition, when z/y is more than 3, free electrons for obtaining an infrared shielding effect will not be generated.

The composite tungsten oxide film relating to one embodiment of the present invention does not contain organic components substantially. As described in below, the composite tungsten oxide film relating to one embodiment of the present invention is deposited by a physical film deposition method, so it is not necessary to use a dispersing agent or a medium resin, or a surfactant or a solvent as the invention relating to Patent Literature 2 and Patent Literature 3. Here, organic components are not contained substantially indicates that organic components intentionally added in the production process of the film, for example a polymeric dispersing agent or the like, are not contained.

In Patent Literature 2, it is indicated that it is preferable to have a particle diameter of 800 nm or less as a particle size of composite tungsten oxide fine particles, and more preferable to have a particle diameter of 100 nm or less, and it is a dispersing body in which fine particles are dispersed in a medium. In the composite tungsten oxide film relating to one embodiment of the present invention, a composite tungsten oxide is deposited continuously without a particle shape in a state that organic components are not contained substantially, so in this point, the present invention is significantly different from the fine particle dispersion film of Patent Literature 2.

The composite tungsten oxide is known for a crystal structure such as hexagonal crystal, cubical crystal, tetragonal crystal, or orthorhombic crystal, and for a non-crystalline structure. The composite tungsten oxide film relating to one embodiment of the present invention may contain a crystal structure such as hexagonal crystal, cubical crystal, tetragonal crystal, or orthorhombic crystal, and a non-crystalline structure, but it is preferable to contain a lot of elements composing a hexagonal crystal phase having higher absorbing property in an infrared region and its crystal phase.

Figure 2:
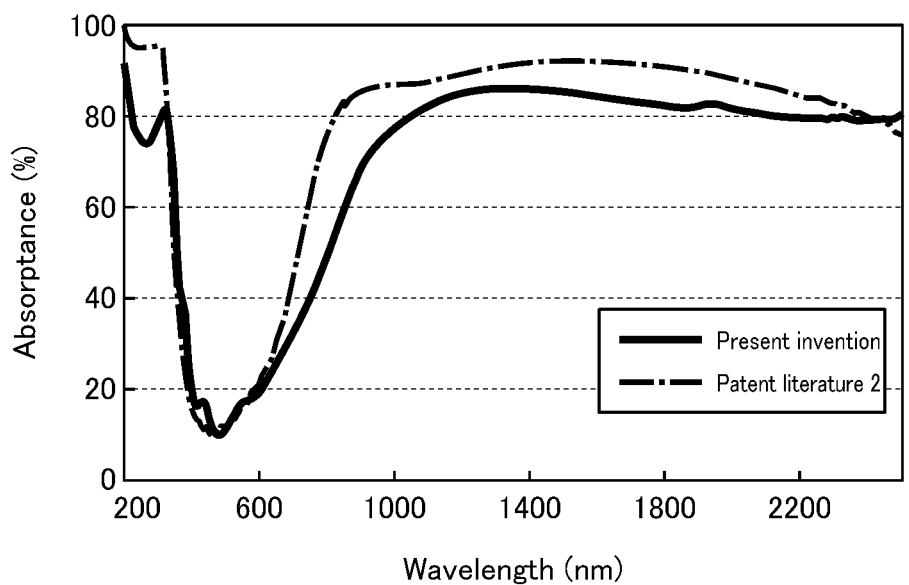
FIG. 2 is a view illustrating a difference between a representative example illustrating a light absorbing property of a composite tungsten oxide film of the present invention and an infrared shielding fine particle dispersion described in Patent Literature 2.

FIG. 1 is a view illustrating a difference between a representative optical characteristic of a composite tungsten oxide film of the present invention and a representative optical characteristic of an infrared shielding material fine particle dispersion described in Patent Literature 2, and FIG. 2 is a view illustrating a difference between a representative example illustrating a light absorbing property of a composite tungsten oxide film of the present invention and an infrared shielding fine particle dispersion described in Patent Literature 2. The composite tungsten oxide film relating to one embodiment of the present invention absorbs light in an infrared region significantly. On the other hand, when comparing with a film (fine particle dispersion film) composed of fine particle dispersion containing composite tungsten oxide fine particles of Patent Literature 2, as illustrated in FIGS. 1 and 2, in the composite tungsten oxide film relating to one embodiment of the present invention, an absorption of light in a near infrared region around 700 to 1000 nm is low. Therefore, the composite tungsten oxide film relating to one embodiment of the present invention is having a selective wavelength transmissivity around 700 to 1000 nm, which is difficult in the fine particle dispersion film, and also, although an infrared shielding function, a photothermal conversion function, and a photoelectric conversion function are lower than the fine particle dispersion film, it is having sufficiently high functions compared to other materials. By this function, it can be used in a communication device, an imaging device, and a sensor using a near infrared light for on-vehicle use.

In the composite tungsten oxide film relating to one embodiment of the present invention, a transmittance in a wavelength of 550 nm is 50% or more, a transmittance in a wavelength of 1400 nm is 30% or less, and also, an absorptance in a wavelength of 1400 nm is 35% or more. In other words, it is necessary that a transmittance in a wavelength of 550 nm is 50% or more as an index of transparency in a visible light, and further, it is necessary that a transmittance in a wavelength of 1400 nm is 30% or less, and also, an absorptance in a wavelength of 1400 nm is 35% or more as an index of a shielding performance and an absorbing performance of light in an infrared region. In addition, an absorptance is a value subtracting a transmittance and a reflectance from one.

It can be used according to use even if a transmittance in a wavelength of 550 nm, which is used as an index of transparency, is lower than the above value. For example, in a window film for a vehicle, it is preferable that a window of rear sheet is in black or dark gray from a point of view of protecting privacy, and a pigment may be used intentionally in addition to a heat ray shielding material.

An index of transparency in the present invention indicates a characteristic of the film in a state which does not contain pigment or the like, which was used intentionally in the above. When an index of transparency is lower than the above value, a lighting will be poor, and for example a room will be dark, and as a result, an outside scene may be hard to see.

Similarly, it can have a configuration that a transmittance in a wavelength of 1400 nm and an absorptance in a wavelength of 1400 nm do not satisfy the above values, indicated as an index for a shielding performance and an absorbing performance of light, but in these cases, a transmission of an infrared light will be high, and leads to a rise of a room temperature and a scorched feeling of skin in a heat shielding, and leads to a decrease in a quantity of generated heat in a photothermal conversion.

In the composite tungsten oxide film relating to one embodiment of the present invention, it is preferable that an absorptance in a wavelength of 800 nm with respect to an absorptance in a wavelength of 1400 nm is 80% or less. When an absorptance in a wavelength of 800 nm with respect to an absorptance in a wavelength of 1400 nm is more than 80%, a transmission in a near infrared region in a wavelength of 700 to 1200 nm will be decreased, and it will not be suitable for use in a purpose of light transmission in the above region, and light absorption and shielding in a high infrared region. Therefore, it cannot be used in a communication device, an imaging device, a sensor or the like, using a near infrared light.

The composite tungsten oxide film relating to one embodiment of the present invention is preferably formed in a film thickness of more than 20 nm. As described in below, the composite tungsten oxide film relating to one embodiment of the present invention is a film deposited by a physical method obtained by a film deposition by a sputtering method or the like, and for example in a film deposited by a heat treatment after applying a solution described in Patent Literature 3, it is formed by volatilizing a component of a solvent, a resin or the like which will be necessary for a film deposition, so a residual stress will be generated to a film accordingly, and a defect may be inhered such as a residue of volatile component or a void. The composite tungsten oxide film relating to one embodiment of the present invention is deposited without containing a volatile component, so a residual stress of the film according to the film deposition becomes small, and also, a defect such as a residue of volatile component or a void does not occur. Therefore, a film without a crack or an exfoliation is formed.

When a film thickness of the composite tungsten oxide film is 20 nm or less, a sufficient absorbing performance in an infrared region cannot be obtained, and an infrared transmittance in a wavelength of 1400 nm will be more than 30%. In the present invention, there is no particular limit to an upper limit of a film thickness, as long as it is a thickness more than the above film thickness. However, when a film thickness becomes too thick, a transmittance in a visible light region in a wavelength of 550 nm will be less than 50%, and there may be a case that a visible light transmissivity will be bad, or an exfoliation of a film occurs by an effect of a residua stress at the time of film deposition. A transmittance of a film can be measured using a spectrophotometer.

In the composite tungsten oxide film relating to one embodiment of the present invention, a sheet resistance is $1.0*10^5$ ohms per square or more, more preferably, a sheet resistance is $1.0*10^{10}$ ohms per square or more. When a sheet resistance of the film is less than the above value, free electrons of the film shields a static electric field and reflects radio waves, so a radio wave transmissivity will be decreased, and leads to an interference fault by a reflection of radio waves, or a communication failure of the devices using radio waves such as a portable phone. On the other hand, an electrostatic charge or a dim by an electrostatic charge occurs according to use of the film, so it may have a harmful effect when a sheet resistance is too high. A sheet resistance can be adjusted by the following conditions of a film deposition and a heat treatment. A sheet resistance can be measured using, for example a resistivity meter.

In addition, the composite tungsten oxide film relating to one embodiment of the present invention is normally deposited as a continuous film, but it can be in any kind of form as long as it is having a feature of the present invention, even if it is in a form applied with a reflection control by patterning, or a form applied with a lens function by providing an unevenness.

From the above, according to the composite tungsten oxide film relating to one embodiment of the present invention, the composite tungsten oxide film having a substantial radio wave transmissivity, and having both of an infrared light absorbing property in an infrared light region and a transparency in a visible light region, and also, having features different from a composite tungsten oxide film described in Patent Literature 2 and Patent Literature 3, is provided.

<2. Method for Producing Composite Tungsten Oxide Film>

Figure 3:
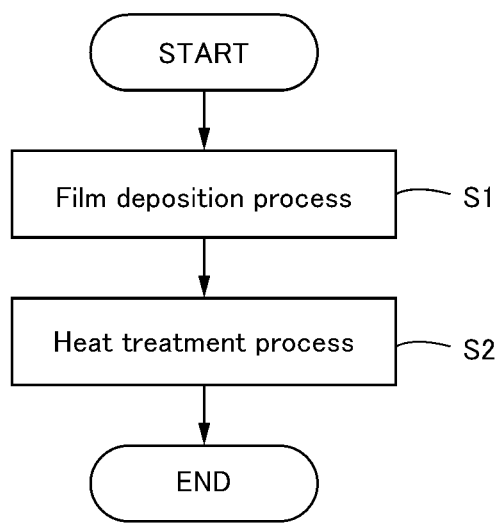
FIG. 3 is a flow chart illustrating an outline of a process in a method for producing a composite tungsten oxide film relating to one embodiment of the present invention.

Next, explaining about a method for producing a composite tungsten oxide film. FIG. 3 is a flow chart illustrating an outline of a method for producing a composite tungsten oxide film relating to one embodiment of the present invention. A method for producing a composite tungsten oxide film relating to one embodiment of the present invention is a method for producing a composite tungsten oxide film comprising an element M, tungsten W, and oxygen O as main components, the method comprising: a film deposition process S1 for deposition of a film by a physical film deposition method; and a heat treatment process S2 for heat-treating the film. Hereinafter, explaining in detail about each process.

(2-1. Film deposition process)

In a film deposition process S1, a film is deposited by using a physical film deposition method. As a physical film deposition method of a composite tungsten oxide film relating to one embodiment of the present invention, there are a vacuum deposition method, a sputtering method, an ion plating method, an ion beam method and the like. Among them, the sputtering method is capable of controlling a film thickness and a film quality with high accuracy, as a film deposition process is stable, and also, as a film deposition is dense and a film quality is strong, and as an energy of film deposition particles is high and an adhesion force is strong. Further, the sputtering method is preferable as it is capable of film deposition of metals, alloys, and compounds having high melting point, and capable of film deposition of oxides, nitrides or the like by introducing a reactive gas, and having a feature that an adjustment of a composition is relatively easy, and often used in a wide range of fields such as general purpose articles of a window film or a mirror, and electronic devices such as a liquid crystal display element or a hard disc, and as there are many production apparatuses.

A sputtering target for depositing a composite tungsten oxide film represented by a general formula $M_xW_yO_z$ can be selected from various configurations, for example a sputtering target composed of an element M and an element W, a sputtering target composed of an element M and an compound of an element W and an element O, a sputtering target composed of an element W and a compound of an element M and an element O, and a sputtering target composed of a compound of an element M, an element W and an element O. It is preferable to use a sputtering target previously formed as a compound phase. When a sputtering target is previously formed as a compound phase, dependency of a film composition by a difference in a vapor pressure of each element can be reduced, and a stable film deposition will be possible.

The sputtering target may be in a form of, for example a sintering body formed by sintering the sputtering target composition, or a green compact formed by compacting a powder composed of particles of the sputtering target composition.

In addition, the sputtering target is formed in a sintering body or a green compact as described in the above, so it does not contain organic components, so it is not limited in a storage or a transportation as dangerous substances such as fine particle dispersion liquid in which fine particles are dispersed in an organic solvent, and it also does not contain a volatile component, so it can be stored for a long time stably and safely. In addition, naturally, a film deposited by using the sputtering target does not contain organic components.

When the sputtering target is, for example a conductor with a specific resistance of 1 ohm per cm or less, a DC sputtering device with high productivity can be used. In addition, when a sputtering target is, for example a sintering body with a relative density of 70% or more, a crack by a vibration at the time of transportation is decreased, and it will be in a form suitable for an industrial production by a reason such that it will not be necessary to take an extreme care for handling at the time of attachment to the device or the like.

An atmosphere of the film deposition process can be selected variously, but an inert gas atmosphere, or a mixed atmosphere of an inert gas and an oxygen gas is preferable. As an inert gas, for example, a rare gas such as a helium gas or an argon gas, a nitrogen gas or the like can be used, but when it is a nitrogen gas, nitrides may be formed according to a selected element M, so it is preferable to use an argon gas, which is generally used and easily available. An oxygen gas may be mixed in an optional rate, but when there is too much oxygen gas, a film deposition rate will be extremely slow, so the rate of the oxygen gas is preferably 20% or less.

A film after the film deposition is normally non-crystalline, but a diffraction peak based on a crystal may appear at the time of X-ray diffraction analysis.

(2-2. Heat treatment process)

Next, in a heat treatment process S2, the film obtained in the film deposition process S1 is heat-treated. In order to obtain the features of the film described in the present invention, it is necessary to change a condition of a heat treatment atmosphere of the film according to a ratio of an oxygen gas in the film deposition atmosphere in the film deposition process S1. The heat treatment atmosphere is an oxidizing or an inert or a reducing atmosphere.

When a ratio of an oxygen gas in the film deposition atmosphere in the film deposition process S1 is 0% or more and less than 1%, in the heat treatment process S2, it can be heat-treated in an oxidizing atmosphere such as an atmospheric air. The oxidizing atmosphere is, for example an atmospheric air or a mixed gas of nitrogen and oxygen in which oxygen is contained for 5% to 20%.

In this case, a heat treatment temperature is preferably 400° C. to 600° C. When the heat treatment temperature is less than 400° C., the film remains to be non-crystalline and not crystallized, or even if it is crystallized, a diffraction peak of hexagonal crystal in X-ray diffraction will be extremely weak, and an absorbing property in an infrared region will be low. Even if the heat treatment temperature is more than 600° C., the features of the film of the present invention can be obtained, but practical defects occurs, such that the film and the base material react to each other, or the film exfoliates from the base material.

When a ratio of an oxygen gas in the film deposition atmosphere in the film deposition process S1 is 1% or more and 10% or less, an atmosphere in the heat treatment process S2 is preferably an inert atmosphere, or an atmosphere containing a reducing gas. As the inert gas atmosphere, for example a rare gas such as an argon gas, or a nitrogen gas can be considered. As a reducing gas, for example a hydrogen gas can be considered. The atmosphere containing a reducing gas may be a hydrogen gas only, a mixed gas of hydrogen and nitrogen, a mixed gas of hydrogen and a rare gas such as argon, or the like.

In this case, a heat treatment temperature is preferably 400° C. to 900° C. When the heat treatment temperature is less than 400° C., the film remains to be non-crystalline and not crystallized, or even if it is crystallized, a diffraction peak of hexagonal crystal in X-ray diffraction will be extremely weak, and an absorbing property in an infrared region will be low. Even if the heat treatment temperature is more than 900° C., the features of the film of the present invention can be obtained, but practical defects occurs, such that the film and the base material react to each other, or the film exfoliates from the base material.

When a ratio of an oxygen gas in the film deposition atmosphere in the film deposition process S1 is more than 10%, an atmosphere in the heat treatment process S2 is preferably an atmosphere containing a reducing gas. As a reducing gas, for example a hydrogen gas can be considered. The atmosphere containing a reducing gas may be a hydrogen gas only, a mixed gas of hydrogen and nitrogen, a mixed gas of hydrogen and a rare gas such as argon, or the like.

In this case, a heat treatment temperature is 400° C. to 900° C. When the heat treatment temperature is less than 400° C., the film remains to be non-crystalline and not crystallized, or even if it is crystallized, a diffraction peak of hexagonal crystal in X-ray diffraction will be extremely weak, and an absorbing property in an infrared region will be low. Even if the heat treatment temperature is more than 900° C., the features of the film of the present invention can be obtained, but practical defects occurs, such that the film and the base material react to each other, or the film exfoliates from the base material.

When a ratio of an oxygen gas in the film deposition atmosphere is 1% or more and the heat treatment atmosphere contains an oxidizing gas, or when a ratio of an oxygen gas in the film deposition atmosphere is more than 10% and the heat treatment atmosphere is an inert atmosphere, an absorbing property in an infrared region of the film after the heat treatment will be decreased, and the effect of the present invention cannot be obtained.

When a ratio of an oxygen gas in the film deposition atmosphere is less than 1% and the heat treatment atmosphere is an inert atmosphere or a reducing atmosphere, a film resistance of the film after the heat treatment will be decreased and it will be a film inferior in a radio wave transmissivity.

In any of the above heat treatment temperatures, it is sufficient that a heat treatment time is 5 to 60 minutes according to a heat conduction of the base material.

In addition, a method for producing a transparent conductive film using a composite tungsten oxide is described in Patent Literature 3 (paragraph [0065]). According to this method, it is indicated that the transparent conductive film of Patent Literature 3 can be obtained by applying a solution containing a composite tungsten compound to a base material as a starting tungsten raw material solution, and then, by heat-treating the solution in an atmosphere of any of an inert gas, a mixed gas of an inert gas and a reducing gas, and a reducing gas. According to this method, a surfactant having a polysiloxane skeleton containing organic components is added to an ammonium metatungstate aqueous solution and a chloride aqueous solution of the element M to prepare the solution.

In an example 2 of Patent Literature 3, a feature of a film using rubidium (Rb) as the element M is indicated in FIG. 3 of Patent Literature 3, and an absorptance in a wavelength of 800 nm with respect to an absorptance in a wavelength of 1400 nm calculated from a reflectance and a transmittance read from FIG. 3 of Patent Literature 3 is approximately more than 90%, and it is having a feature similar to a film formed by a coating liquid containing conventional composite tungsten oxide fine particles, which is different from the composite tungsten oxide film of the present invention.

In addition, FIG. 2 of the present application is a drawing illustrating an absorptance in an equivalent transmittance in a visible light region, and each value in this case were such that a cesium tungsten oxide sputtering film (present invention) was 57.3%, and a cesium tungsten oxide ink applied film (fine particle dispersion film) (Patent Literature 2) was 83.0%. Therefore, it is understood that the composite tungsten oxide film relating to one embodiment of the present invention is having features different from a composite tungsten oxide film described in Patent Literature 2 or Patent Literature 3, in a wavelength of around 800 nm (700 to 1200 nm).

From the above, according to the method for producing the composite tungsten oxide film relating to one embodiment of the present invention, the composite tungsten oxide film having the above features is provided by a physical production method without a limitation at the time of a transportation and excellent for a long time storage of raw materials used, and further, by a relatively harmless method at the time of a film deposition, which is widely used industrially.

<3. Film-Deposited Base Material>

A film-deposited base material relating to one embodiment of the present invention is a base material in which the composite tungsten oxide film is deposited on at least one surface of a base material to be subjected to film deposition. The base material to be subjected to film deposition is not limited particularly, as long as the composite tungsten oxide film relating to one embodiment of the present invention can be deposited.

The base material to be subjected to film deposition is preferably a base material having a thermal deformation temperature or a softening point of 400° C. or more, as the heat treatment temperature of the film after a film deposition is 400° C. or more. When a base material having a thermal deformation temperature or a softening point of less than 400° C. is used, there will be a problem such that a crack is generated at the film and the film exfoliates from the base material to be subjected to film deposition at the time of heat treatment. Preferably, a thermal expansion coefficient of the base material to be subjected to film deposition is close to a thermal expansion coefficient of the film. In addition, when the film is used by exfoliating the film from the base material to be subjected to film deposition, it is not always necessary to be the above condition, and for example, it may be a base material melting at 400° C. or less.

As the base material to be subjected to film deposition having a thermal deformation temperature or a softening point of 400° C. or more, there are a glass, ceramics, a monocrystal and the like. It is not necessary that the base material to be subjected to film deposition is always transparent, but when using the composite tungsten oxide film of the present invention together with the base material, a transparent base material is required. As the transparent base material, for example, there are a glass, transparent ceramics such as YAG or $Y_2O_3$, and a monocrystal such as sapphire. Among them, from a point of view of an easy availability, an inexpensiveness, a weatherability, a chemical resistance and the like, it is preferable to use a glass having a softening point of 400° C. or more as the base material to be subjected to film deposition.

In addition, the features of the present invention are not impaired even if the base material is having a curved surface or an uneven surface, and not a plane surface, so the base material may be selected variously.

From the above, according to the film-deposited base material relating to one embodiment of the present invention, the composite tungsten oxide film having a transmissivity in a near infrared region, in addition to a function to shield light by absorbing light, a function to generate heat by absorbing light, and a function to release electrons by absorbing light, is provided.

<4. Article>

An article relating to one embodiment of the present invention is having one or more of the composite tungsten oxide film and/or the film-deposited base material. The article having the composite tungsten oxide film and/or the film-deposited base material of the present invention may be any article as long as the article is having any of, or a plurality of a function to shield light by absorbing light, a function to generate heat by absorbing light and a function to release electrons by absorbing light.

In addition, even if the composite tungsten oxide film and/or the film-deposited base material of the present invention is used together with, for example a film or particles having other functions, it is included in the article using the functions described in the present invention.

As the article having a function to shield light by absorbing light, for example, there is a heat-shielding glass. The heat-shielding glass is having a feature to shield heat even if it is transparent, and it reduces a temperature rise in a vehicle or a temperature rise in a room by a solar light in summer. In addition, as an example of other article having a function to shield light by absorbing light, for example, there are an optical filter for cutting light in an infrared region generated by a light emission element, a medium for improving a performance of a light detection element by absorbing a light noise in an infrared region, and an article for forgery prevention such as JP 2015-117353 A. As the article having a function to generate heat by absorbing light, for example, there are a fiber such as WO2006-049025, a transfer film for OLED such as JP 2015-527700 A, an ink for forming a laser image such as JP 2016-528343 A, a soil covering film for agriculture and horticulture such as WO2006-100799, and a curable coating agent such as JP 2012-021066 A.

As the article having a function to release electrons by absorbing light, for example, there are a solar cell such as JP 2018-026586 A, and an optical sensor such as JP 2017-092210 A.

From the above, according to the article relating to one embodiment of the present invention, the article having low environmental load at the time of production and capable of reducing energy, by using the composite tungsten oxide film having a transmissivity in a near infrared region, in addition to a function to shield light by absorbing light, a function to generate heat by absorbing light, and a function to release electrons by absorbing light, is provided for various use inexpensively in large quantities.

EXAMPLES

Hereinafter, explaining about the present invention concretely using examples, but the present invention is not limited to the examples in below.

Example 1

In example 1, a cesium tungsten oxide powder (YM-01 made by SUMITMO METAL MINING CO., LTD.), in which an atomic ratio of Cs/W is 0.33, was charged into a hot-pressing device, and sintered in a condition of a vacuum atmosphere, a temperature of 950° C., and a pressing pressure of 250 kgf/cm², and a cesium tungsten oxide sintered body was prepared. As a result of chemical analysis of a composition of the sintered body, Cs/W was 0.33. This oxide sintered body was grinded by mechanical machining to a diameter of 153 mm and a thickness of 5 mm, and it was bonded to a backing plate made of stainless steel by using a metal indium brazing material, and a cesium tungsten oxide sputtering target was prepared.

Next, this sputtering target was mounted to a DC sputtering device (SBH2306 made by ULVAC, Inc.), and a cesium tungsten oxide film was deposited on a glass substrate (EXG made by Corning Inc., thickness of 0.7 mm) in a condition that an ultimate vacuum was $5*10^{-3}$ Pa or less, an atmosphere at the time of film deposition was a mixed gas atmosphere of 5% oxygen/95% argon, a pressure of the gas was 0.6 Pa, and an input power was 600 W in direct current (film deposition process S1). A film thickness after the film deposition was 400 nm. A structure of the deposited film was examined by using an X-ray diffraction device (X'Pert-PRO (made by PANalytical)). The deposited film was having a non-crystalline structure in which a diffraction peak derived from a crystal structure was not confirmed.

The deposited film was charged into a lamp heating furnace (HP-2-9 made by YONEKURA MFG Co., Ltd.), and heat-treated for 30 minutes at a temperature of 500° C. in a nitrogen atmosphere (heat treatment process S2). As a result of chemical analysis of this film after the heat treatment, an atomic ratio x/y of Cs/W was 0.33.

A transmittance T and a reflectance R of the film after the heat treatment were measured by using a spectrophotometer (made by Hitachi, Ltd., model number: V-670). In addition, it was set that (absorptance)=1−(transmittance T)−(reflectance R).

In the film after the heat treatment, a transmittance in a wavelength of 550 nm was 65.2%, a transmittance in a wavelength of 1400 nm was 6.9%, and an absorptance in a wavelength of 1400 nm was 76.3%.

In addition, an absorptance in a wavelength of 800 nm was 51.8%, and a ratio of an absorptance in a wavelength of 800 nm with respect to an absorptance in a wavelength of 1400 nm was 67.9%.

As a result of measurement by using a resistivity meter (Hiresta made by Mitsubishi Chemical Corporation), a sheet resistance of the film after the heat treatment was $1.2*10^{10}$ ohms per square, and the film after the heat treatment was a film having high resistance and low electric conductivity.

From the above, the film heat-treated after the film deposition by the sputtering device was the film having high radio wave transmissivity by absorbing light in an infrared region, and at the same time, maintaining a sufficient transparency in a visible light region.

Examples 2 to 25 and Comparative Examples 1 to 12

A composite tungsten oxide film was prepared by using same device as the example 1, and by changing an element M, a film thickness, a film deposition atmosphere, a heat treatment atmosphere, and time as described in Table 1 and Table 2, and the features of the film were examined. Results of examples and comparative examples are indicated in Table 1 and Table 2.

TABLE 1

| | Element M | Film deposition system | Oxygen amount at the time of film deposition (%) | Film thickness (nm) | x/y of film (M/W) | Heat treatment Atmosphere | Heat treatment Temperature (° C.) | Heat treatment Time (min) | Transmittance (%) Wavelength 550 nm | Transmittance (%) Wavelength 1400 nm | Absorptance (%) Wavelength 800 nm | Absorptance (%) Wavelength 1400 nm | Ratio of absorptance 1400 nm/ 800 nm (%) | Sheet resistance (ohm per square) |
|---|---|---|---|---|---|---|---|---|---|---|---|---|---|---|
| Example 1 | Cs | Sputtering | 5 | 400 | 0.33 | $N_2$ | 500 | 30 | 65.2 | 6.9 | 51.8 | 76.3 | 67.9 | $1.2 \times 10^{10}$ |
| Example 2 | Cs | Sputtering | 5 | 400 | 0.33 | $N_2$ | 400 | 30 | 65.7 | 7.7 | 49.1 | 75.5 | 65.0 | $6.9 \times 10^{10}$ |
| Example 3 | Cs | Sputtering | 5 | 400 | 0.33 | $N_2$ | 800 | 30 | 60.9 | 5.8 | 47.9 | 83.1 | 57.6 | $1.3 \times 10^{10}$ |
| Comparative example 1 | Cs | Sputtering | 5 | 400 | 0.33 | $N_2$ | 300 | 30 | 62.2 | 55.5 | 43.5 | 27.2 | 160.1 | $1.8 \times 10^{11}$ |
| Comparative example 2 | Cs | Sputtering | 5 | 400 | 0.33 | $N_2$ | 1000 | 30 | | | Film is lost by exfoliation | | | |
| Example 4 | Cs | Sputtering | 10 | 400 | 0.33 | $N_2$ | 900 | 30 | 62.0 | 27.2 | 37.0 | 64.7 | 57.2 | $4.1 \times 10^{6}$ |
| Comparative example 3 | Cs | Sputtering | 0 | 400 | 0.33 | $N_2$ | 500 | 30 | 42.5 | 9.1 | 62.1 | 51.5 | 120.6 | $2.5 \times 10^{2}$ |
| Example 5 | Cs | Sputtering | 0 | 400 | 0.33 | Atmospheric air | 500 | 10 | 73.1 | 3.6 | 49.3 | 86.0 | 57.3 | $2.2 \times 10^{12}$ |
| Comparative example 4 | Cs | Sputtering | 5 | 400 | 0.33 | Atmospheric air | 500 | 30 | 76.5 | 83.1 | 1.7 | 1.0 | 172.4 | $2.6 \times 10^{12}$ |
| Comparative example 5 | Cs | Sputtering | 0 | 100 | 0.33 | $N_2$ | 500 | 30 | 72.5 | 11.3 | 50.6 | 44.1 | 114.6 | $3.0 \times 10^{3}$ |
| Comparative example 6 | Cs | Sputtering | 0 | 400 | 0.33 | 1% hydrogen-nitrogen | 500 | 10 | 41.4 | 8.9 | 63.4 | 53.0 | 119.6 | $2.1 \times 10^{2}$ |
| Example 6 | Cs | Sputtering | 10 | 400 | 0.33 | 1% hydrogen-nitrogen | 500 | 30 | 63.6 | 5.2 | 49.8 | 74.0 | 67.3 | $1.5 \times 10^{8}$ |
| Example 7 | Cs | Sputtering | 5 | 400 | 0.39 | $N_2$ | 600 | 30 | 67.9 | 9.1 | 53.1 | 69.0 | 76.9 | $1.2 \times 10^{11}$ |
| Example 8 | Cs | Sputtering | 10 | 400 | 0.39 | $N_2$ | 600 | 30 | 68.8 | 16.8 | 34.3 | 46.4 | 73.8 | $5.6 \times 10^{10}$ |
| Comparative example 7 | Cs | Sputtering | 0 | 400 | 0.39 | $N_2$ | 600 | 30 | 43.0 | 13.5 | 61.1 | 51.0 | 119.8 | $3.0 \times 10^{5}$ |
| Example 9 | Cs | Sputtering | 0 | 400 | 0.39 | Atmospheric air | 500 | 10 | 74.0 | 15.0 | 44.1 | 74.0 | 59.6 | $9.6 \times 10^{11}$ |
| Comparative example 8 | Cs | Sputtering | 5 | 400 | 0.39 | Atmospheric air | 500 | 10 | 77.9 | 82.1 | 3.5 | 2.1 | 166.7 | $2.1 \times 10^{12}$ |
| Example 10 | Cs | Sputtering | 10 | 400 | 0.39 | 1% hydrogen-nitrogen | 500 | 30 | 66.4 | 12.6 | 44.2 | 75.0 | 58.9 | $8.0 \times 10^{8}$ |

TABLE 2

| | Element M | Film deposition system | Oxygen amount at the time of film deposition (%) | Film thickness (nm) | x/y of film (M/W) | Heat treatment Atmosphere | Heat treatment Temperature (°C.) | Heat treatment Time (min) | Transmittance (%) Wavelength 550 nm | Transmittance (%) Wavelength 1400 nm | Absorptance (%) Wavelength 1400 nm | Absorptance (%) Wavelength 800 nm | Ratio of absorptance 800 nm/1400 nm (%) | Sheet resistance (ohm per square) |
|---|---|---|---|---|---|---|---|---|---|---|---|---|---|---|
| Example 11 | Cs | Sputtering | 5 | 800 | 0.15 | $N_2$ | 600 | 30 | 63.8 | 18.7 | 70.9 | 35.1 | 49.5 | $4.4 \times 10^8$ |
| Comparative example 9 | Cs | Sputtering | 0 | 800 | 0.15 | $N_2$ | 600 | 30 | 41.6 | 24.6 | 47.9 | 42.1 | 88.0 | $2.9 \times 10^4$ |
| Example 12 | Cs | Sputtering | 0 | 800 | 0.15 | Atmospheric air | 500 | 10 | 71.6 | 9.7 | 79.9 | 33.4 | 41.8 | $8.9 \times 10^{11}$ |
| Comparative example 10 | Cs | Sputtering | 5 | 800 | 0.15 | Atmospheric air | 500 | 10 | 74.9 | 81.4 | 0.9 | 1.5 | 172.4 | $1.4 \times 10^{12}$ |
| Comparative example 11 | Cs | Sputtering | 0 | 800 | 0.15 | 1% hydrogen-nitrogen | 500 | 30 | 40.5 | 24.1 | 49.3 | 43.0 | 87.2 | $8.5 \times 10^3$ |
| Example 13 | Cs | Sputtering | 10 | 800 | 0.15 | 1% hydrogen-nitrogen | 500 | 30 | 62.3 | 14.0 | 68.8 | 33.8 | 49.1 | $9.6 \times 10^8$ |
| Comparative example 12 | Cs | Sputtering | 5 | 20 | 0.33 | $N_2$ | 600 | 30 | 86.4 | 72.6 | 17.1 | 5.6 | 32.7 | $2.5 \times 10^{11}$ |
| Example 14 | Rb | Sputtering | 5 | 800 | 0.33 | $N_2$ | 500 | 30 | 73.2 | 4.6 | 85.0 | 34.2 | 40.2 | $6.7 \times 10^9$ |
| Example 15 | Tl | Sputtering | 5 | 1300 | 0.33 | $N_2$ | 500 | 30 | 70.6 | 4.0 | 85.6 | 29.5 | 34.5 | $4.4 \times 10^9$ |
| Example 16 | K | Sputtering | 5 | 1600 | 0.33 | $N_2$ | 500 | 30 | 64.7 | 4.2 | 85.4 | 30.1 | 35.2 | $3.1 \times 10^9$ |
| Example 17 | Ba | Sputtering | 5 | 1600 | 0.33 | $N_2$ | 500 | 30 | 60.4 | 7.2 | 82.4 | 43.1 | 52.3 | $3.2 \times 10^9$ |
| Example 18 | Na | Sputtering | 5 | 1200 | 0.5 | $N_2$ | 500 | 30 | 60.8 | 4.1 | 85.5 | 53.3 | 62.4 | $4.8 \times 10^9$ |
| Example 19 | Na | Sputtering | 5 | 500 | 0.75 | $N_2$ | 500 | 30 | 62.0 | 21.7 | 67.9 | 45.6 | 67.1 | $1.1 \times 10^{10}$ |
| Example 20 | K | Sputtering | 5 | 1200 | 0.55 | $N_2$ | 500 | 30 | 64.7 | 5.2 | 84.4 | 54.4 | 64.4 | $4.7 \times 10^9$ |
| Example 21 | In | Sputtering | 5 | 1200 | 0.33 | $N_2$ | 500 | 30 | 66.2 | 18.7 | 70.9 | 28.5 | 40.1 | $4.6 \times 10^9$ |
| Example 22 | Sn | Sputtering | 5 | 1200 | 0.33 | $N_2$ | 500 | 30 | 61.9 | 22.3 | 67.3 | 38.2 | 56.7 | $4.2 \times 10^9$ |
| Example 23 | Na | Sputtering | 5 | 1000 | 0.33 | $N_2$ | 500 | 30 | 60.2 | 4.9 | 84.7 | 51.2 | 60.4 | $5.6 \times 10^9$ |
| Example 24 | Rb | Sputtering | 5 | 1100 | 0.25 | $N_2$ | 500 | 30 | 68.9 | 4.1 | 85.5 | 39.5 | 46.2 | $4.9 \times 10^9$ |
| Example 25 | Cs | Sputtering | 5 | 1500 | 0.15 | $N_2$ | 500 | 30 | 61.2 | 4.0 | 85.6 | 42.1 | 49.2 | $3.6 \times 10^9$ |

From Table 1 and Table 2, in the examples 1 to 25 included in the present invention, it was confirmed that the film having transparency in a visible light region in which a transmittance in a wavelength of 550 nm is 50% or more, and also, having an infrared light absorbing property in which a transmittance in an infrared light region in a wavelength of 1400 nm is 30% or less and an absorptance in the infrared light region is 35% or more, and further, having a substantial radio wave transmissivity in which a resistance is $10^5$ ohms per square or more, were provided. Further, in the examples 1 to 25 included in the present invention, it was confirmed that an absorptance in a wavelength of 800 nm with respect to an absorptance in a wavelength of 1400 nm was 80% or less, and that it is having a selective wavelength transmissivity around 700 nm to 1000 nm. In addition, in all of the examples 1 to 25, the films were deposited by a sputtering method, so organic components are not contained.

In addition, it was explained in detail about one embodiment and each example of the present invention as the above, but it is easy for those who skilled in the art to understand that various modifications are possible without substantially departing from new matters and effects of the present invention. Therefore, all of such modified examples are included within the scope of the present invention.

For example, a term used at least once in the description or drawings together with a different term that is broader or the same in meaning can also be replaced by the different term in any place in the description or drawings. Further, the configurations of the composite tungsten oxide film and the method for producing same, and also, a film-deposited base material and an article each provided with the film, are not limited to those described in one embodiment and each example of the present invention, but may be carried out in various modifications.

The composite tungsten oxide film relating to the present invention is having high transparency in a visible light region and excellent light absorbing property in an infrared region, and also, having a radio wave transmissivity, so it is having a possibility to be used in a wide range of applications by using any of, or a plurality of a function to shield light by absorbing light, a function to generate heat by absorbing light, and a function to release electrons by absorbing light.

The invention claimed is:

1. A composite tungsten oxide film comprising a composition represented by a general formula $M_xW_yO_z$ (wherein, an element M is one or more elements selected from alkaline metal, alkaline earth metal, Fe, In, Tl, and Sn, an element W is tungsten, and an element O is oxygen) as main components,
    wherein $0.001 \leq x/y \leq 1$, $2.2 \leq z/y \leq 3.0$,
    organic components are not contained substantially, a sheet resistance is more than $10^{10}$ ohms per square, a transmittance in a wavelength of 550 nm is 50% or more, a transmittance in a wavelength of 1400 nm is 30% or less, and, an absorptance in a wavelength of 1400 nm is 35% or more, and
    an absorptance in a wavelength of 800 nm with respect to an absorptance in a wavelength of 1400 nm is 80% or less.

2. The composite tungsten oxide film according to claim 1, wherein the composite tungsten oxide film is derived from a sputtering film deposition.

3. The composite tungsten oxide film according to claim 1, wherein the element M is one or more elements selected from Cs, Rb, K, Tl, In, Ba, Li, Na, Ca, Sr, Fe and Sn.

4. The composite tungsten oxide film according to claim 1, wherein the composite tungsten oxide film has a film thickness thicker than 20 nm.

5. A film-deposited base material, wherein the composite tungsten oxide film according to claim 1 is deposited on at least one surface of a base material to be subjected to film deposition.

6. The film-deposited base material according to claim 5, wherein the film-deposited base material is having a thermal deformation temperature or a softening point of 400° C. or more.

7. The film-deposited base material according to claim 5, wherein the base material to be subjected to film deposition is a glass.

8. A method for producing the composite tungsten oxide film according to claim 1 comprising the composition represented by the general formula $M_xW_yO_z$ (wherein, the element M is one or more elements selected from alkaline metal, alkaline earth metal, Fe, In, Tl, and Sn, the element W is tungsten, and the element O is oxygen, and $0.001 \leq x/y \leq 1$, $2.2 \leq z/y \leq 3.0$) as main components, the method comprising:
    a film deposition process for deposition of a film by a physical film deposition method using a sputtering target composed of a compound of the element M, the element W, and the element O; and
    a heat treatment process for heat-treating the film,
    wherein the conditions of the film deposition process and the heat treatment process are as any of 1) or 2) below:
    1) after deposition of the film by sputtering in an inert gas in the film deposition process, the film is heat-treated at a temperature of 400° C. to 600° C. in a gas containing oxygen in the heat treatment process;
    2) After deposition of the film by sputtering in a gas containing oxygen in the film deposition process, the film is heat-treated at a temperature of 400° C. to 900° C. in an inert or reducing atmosphere in the heat treatment process.

* * * * *